United States Patent [19]

Mysiak

[11] 3,951,491

[45] Apr. 20, 1976

[54] ELECTRICAL CONNECTOR

[75] Inventor: Eugene J. Mysiak, Cicero, Ill.

[73] Assignee: Molex Incorporated, Lisle, Ill.

[22] Filed: Dec. 19, 1974

[21] Appl. No.: 534,429

[52] U.S. Cl. .................. 339/17 CF; 339/176 MP
[51] Int. Cl.² ........................................ H01R 13/48
[58] Field of Search ............ 339/17 R, 17 C, 17 CF, 339/17 LM, 17 M, 74 R, 75 MP, 176 MP; 317/101 CC

[56] References Cited
UNITED STATES PATENTS

| | | | |
|---|---|---|---|
| 3,323,023 | 5/1967 | Walker | 339/17 CF X |
| 3,430,182 | 2/1969 | Blanche | 339/17 R |
| 3,447,040 | 5/1969 | Denton, Jr. | 339/17 R X |
| 3,537,063 | 10/1970 | Beaulieu | 339/74 R |
| 3,594,684 | 7/1971 | Miller | 339/17 LM |
| 3,718,842 | 2/1973 | Abbott et al. | 317/101 CC |
| 3,753,048 | 8/1973 | Tuck | 339/176 MP X |
| 3,873,173 | 3/1975 | Anhalt | 339/17 CF |
| R26,692 | 10/1969 | Ryeltlemann | 339/176 MP |

OTHER PUBLICATIONS

*Becon Connector*, Becon Printed Circuit Connector; Brown Engineering Co. Huntsville, Alabama; Becon 180° Single 10, Dec. 1961.

*Primary Examiner*—Joseph H. McGlynn
*Assistant Examiner*—Howard N. Goldberg
*Attorney, Agent, or Firm*—Louis A. Hecht

[57] ABSTRACT

An electrical connector for electrically connecting a modular circuit package such as a large scale integrated circuit package having a plurality of conductive interfaces with a printed circuit board. The connector includes a plurality of generally U-shaped resilient stressable terminals each having a bight-portion and two free ends defining a package contacting end which is adapted to engage one of the interfaces and a circuit contacting end which is adapted to engage one of the points of the printed circuit board. The terminals are mounted in an insulated housing. The housing includes a base member having a plurality of terminal receiving recesses for receiving and positioning the bight portion of each terminal against the side thereof. The housing also includes two generally U-cross section cover members, each of which is adapted to snap-fit over each side of the base member. In this manner, the terminals mounted in the recesses are trapped between the cover and the base member.

2 Claims, 5 Drawing Figures

ELECTRICAL CONNECTOR

BACKGROUND OF THE INVENTION

1. Field of the Invention

The present invention relates to electrical connectors and, more particularly, to electrical connectors for modular circuit packages.

2. Brief Description of the Prior Art

Many electrical components are adapted to be electrically connected to a circuit member such as a printed circuit board. Many of these components have leads which are usually soldered to the conductive areas of the board. However, some electrical components have been developed without male leads and have, therefore, created different types of problems in electrically connecting them to a printed circuit board.

One example of an electrical component that does not have a male lead is a leadless modular circuit package such as a large scale integrated circuit package, (also known as Leadless LSI's). The components of this type are usually mounted on a connector or socket which is, in turn, electrically connected to the printed circuit board. Because the electrical component has no male leads, the problem is developing a means of ensuring good contact between the electrical component, the connector, and the printed circuit board.

SUMMARY OF THE INVENTION

It is therefore, the principal object of the present invention to provide a new and improved electrical connector for electrically connecting an electrical component to an electrical circuit member. The connector generally includes a terminal mounted in a housing. The terminal is resiliently stressable and has two free ends defining a component contacting end and a circuit contacting end. The housing includes a base member having a terminal portion for receiving and positioning the terminal in an unstressed state generally around the contour of the terminal portion. The housing also includes a cover member as adapted to be snap-fit over the terminal portion of the base member so that the terminal is trapped between the cover and the base member, and the terminal ends extend outside of the cover member. The cover member engages the terminal so that the terminal is stressed outwardly in a manner to ensure good contact.

DESCRIPTION OF THE PREFERRED EMBODIMENT

Figure 1:
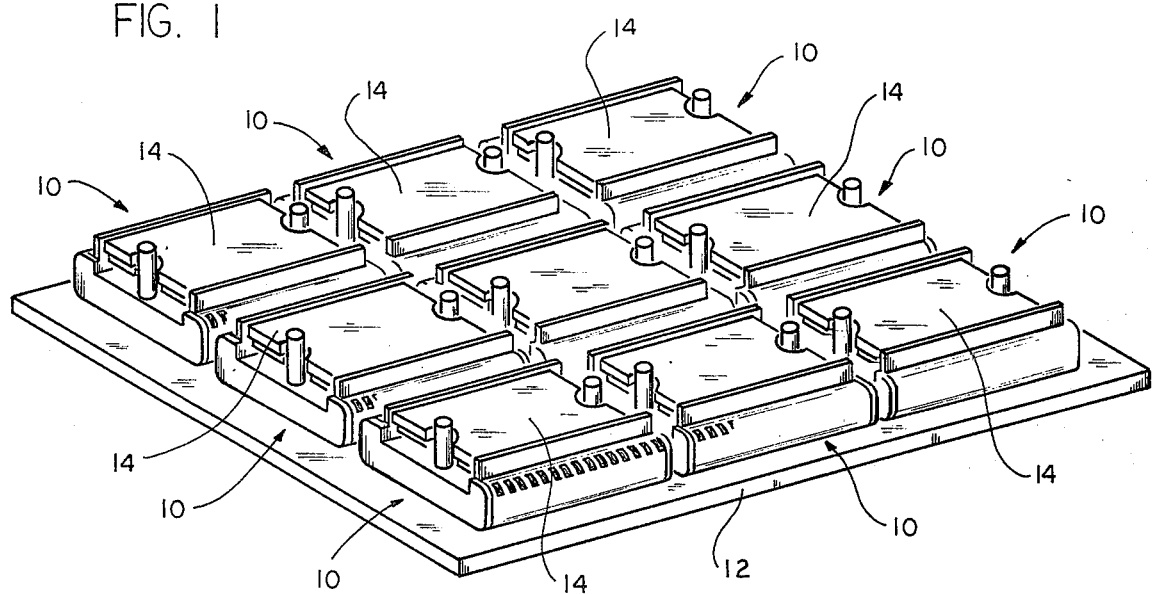
FIG. 1 is a perspective view of a circuit assembly employing a plurality of electrical connectors made according to the present invention.

Turning now to FIG. 1, there is shown a circuit assembly which employs a plurality of electrical connectors, generally designated 10, made according to the present invention. Each electrical connector 10 is in the form of a socket which is mounted on top of a printed circuit board 12. A modular logic package 14 is mounted on top of the connector 10. Because the logic packages 14 are leadless, means (not shown) are provided to clamp down each package 14 onto its respective socket or connector 10. Therefore, each connector 10 serves to establish reliable electrical connections with and to support a logic package 14, and to electrically interconnect the package 14 with the conductive regions or points (not shown) of the printed circuit board 12.

The package 14 in the illustrated arrangement of FIG. 1 can comprise of a leadless large scale integrated circuit package or LSI, having an array of conductive interfaces. However, it should be noted that the principles of the present invention may be applied to connectors for many types of other electrical components. Similarly, although the connector 10 of the present invention is designed for connection to conductive areas or points of the printed circuit board 12, connectors of the present invention may also be adapted for interconnection with external circuitry of many types.

In general, the connector 10 includes a plurality of generally U-shaped, resilient, stressable terminals, generally designated 16, which are mountable in a housing. The housing generally includes a central base member, generally designated 18, and two plastic insulted cover members, each generally designated 20, which are adapted to be snap-fit over a portion of the base member 18 in a manner which will be discussed in greater detail hereinafter.

Turning now to FIGS. 2–5, the base member 18 is seen to include a bottom floor 22 having two opposing ends 24 and two lateral sides 26 upstandingly formed on the periphery thereof. The lower surface of the floor 22 has two longitudinal relief portions 28 generally underlying the sides 26. A first pair of upstanding parallel spaced-apart ribs 30 and a second pair of spaced-apart parallel ribs 32 formed outside of ribs 30 are formed on the upper surface of floor 22. The space between one of the ribs 32 and its facing lateral side 26 forms a cavity 34, whose purpose will become more apparent hereinafter.

Figure 4:
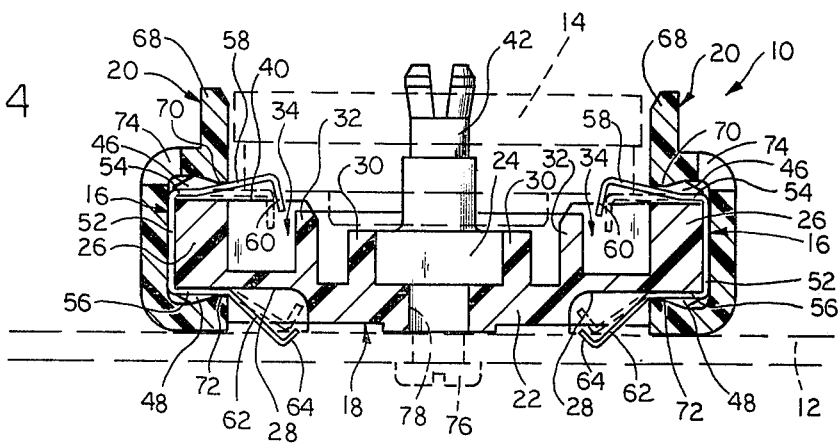
FIG. 4 is a sectional view of the electrical connector showing the printed circuit board and logic package in phantom.
Figure 5:
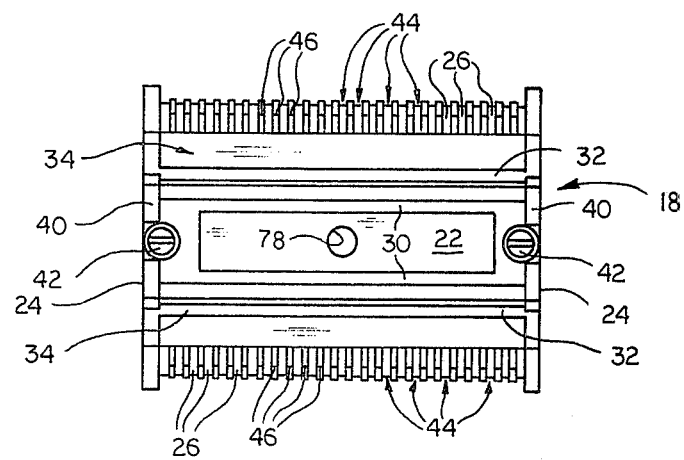
FIG. 5 is a top plan view of the base member comprising a portion of the housing of the connector of the present invention.

Each end 24 of the base member 28 has a top horizontal surface 40 which along with the top surfaces of ribs 30 and 32 comprise a logic package support surface as can best be seen in FIG. 4. Each end 24 also has an upstanding post 42 to aid in positioning the logic package which is manufactured to have mating contours with the posts 42 as is best seen in FIG. 1.

Each lateral side 26 has a plurality of vertical generally U-shaped terminal recesses formed therein. Each recess is adapted to receive one of the terminals 16 therein.

The recesses 44 are defined between a plurality of walls (not numbered). The upper extremity of the recess walls defines an upper ramp portion 46 while the lower extremity of the recess walls define a lower ramp portion 48.

Figure 2:
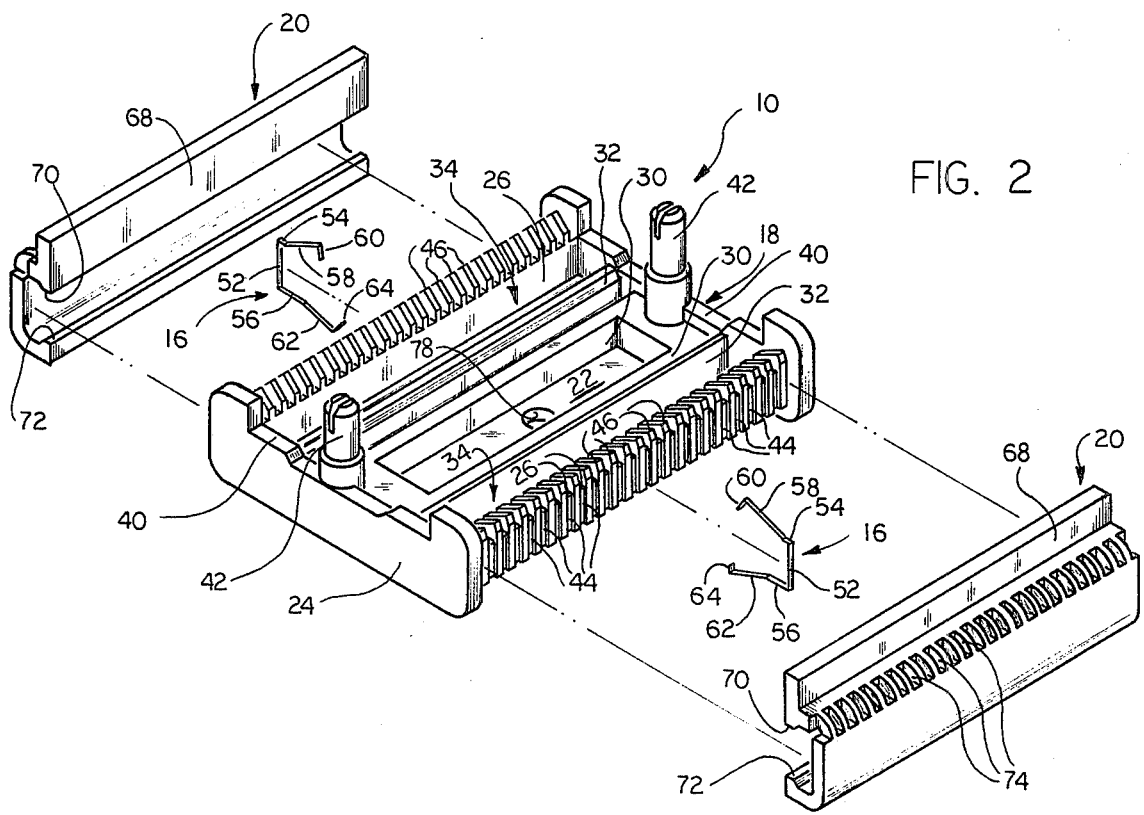
FIG. 2 is a perspective, exploded view of the electrical connector of the present invention.
Figure 3:
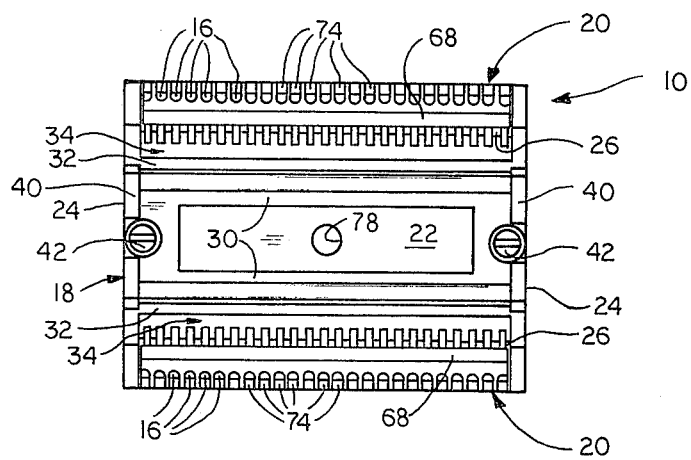
FIG. 3 is a top plan view of the electrical connector of the present invention.

Looking at FIG. 2, each terminal 16 is seen to have a vertical bight portion 52 and an upper horizontal leg portion 54 and a lower horizontal leg portion 56. Extending from the upper leg portion 54 are an upper spring portion 58 and an upper bent portion 60. Extending from the lower leg portion 56 is a lower spring portion 62 and a lower bent portion 64.

The U-shaped portion, i.e., the bight portion 52 and the two leg portions 54 and 56, are adapted to be fitted in each of the recesses 44 as is best seen in FIG. 4. When thus positioned, the terminals 16 are temporarily held in the recesses 44, however, they are not insulated and they are subject to be shaken out of the recesses 44.

Each of the cover members 20 is adapted to be snap-fit over a lateral side 26. Each cover member 20 serves to insulate the terminals 16 mounted within the recesses 44, prevent accidental removal of the terminals, and, by cooperating with the terminals, ensure better contact.

Because each cover 20 snap-fits over the respective side 26, the contour of each cover is generally that of the side 26. In addition, each cover 20 has a top upstanding positioning wall 68. As is best seen in FIG. 4, the positioning walls 68 serve to position the logic package 14 on top of the connector 10.

The interior contour of each cover member 20 has a top inward projection 70 and a bottom inward projection 72. Projections 70 and 72 are adapted to engage the top and bottom ramp portions 46 and 48 respectively, in the same fashion as a cam follower follows a cam surface. Because the cover members 20 are made of flexible plastic, the projections 70 and 72 ride along the ramp portions 46 and 48 until they snap over the top thereof. In this manner, a sure mechanical fit is provided. Each of the covers 20 may be removed in a like fashion.

Each cover 20 also has a plurality of openings 74 formed therein. Each of the openings is opposite one of the terminal recesses 44. These openings are adapted to receive therethrough a test probe so that the connection afforded by any one terminal can be effectively monitored.

Looking at FIG. 4, it can be seen that after the projection 70 and 72 have been snap-fit over the ramp portions 46 and 48 respectively, they engage the terminal 16. The spring portions 48 and 62 extend beyond the cover 20. There is sufficient clearance between the projections 70 and 72 and the top and bottom surfaces of the side wall 26 to provide a preloaded spring condition for the spring portion 58.

When the logic package 14 is mounted on the top of the connector 10 and a printed circuit board 12 is secured to the bottom of the connector, the spring portions assume the positions shown in phantom in FIG. 4. The bent portions 60 and 64 of the terminals 16 are received in cavity 34 and relieved portion 28 respectively. Because the ends of the terminal are bent, any possibility of snagging is prevented.

The connector 10 is mounted on the printed circuit board by means of a suitable fastener 76 which is shown in phantom in FIG. 4. The fastener 76 is received through a fastener opening 78 formed in the floor 22 of the base member 18. Suitable means (not shown) are provided between the ribs 30 to secure the fastener 76 so that the connector is in electrical connection with the printed circuit board 12.

I claim:

1. An electrical connector for electrically connecting an electrical component having a plurality of conductive interfaces to a plurality of points on an electrical circuit member, including means to attach said connector to said circuit member, said connector comprising:
   a plurality of generally U-shaped, resilient, stressable terminals, each having a bight portion and two free ends defining a component contacting end which is adapted to engage one of said interfaces and a circuit contacting end which is adapted to engage one of said points of said circuit member; and
   an insulated housing for mounting said terminals, said housing including a base member having means at the top thereof adapted to position said electrical component, a bottom surface adapted to be adjacent said circuit member and two opposing lateral sides, each lateral side having a plurality of terminal receiving recesses for receiving and positioning the bight portion of each terminal against the side so that the component contacting end overlies the top surface and the circuit contacting end underlies the bottom surface, said housing further including two generally U-shaped cross sectioned cover members each of which is adapted to be snap-fit over each side so that terminals mounted in the recesses are trapped between said cover and said base member and said terminal ends extend outside of said cover member, said cover member engaging said terminal, whereby said terminal is stressed outwardly in a manner to ensure good contact.

2. An electrical connector of claim 1 wherein said electrical component is a leadless integrated circuit package and said circuit member is a printed circuit board.

* * * * *